United States Patent [19]
Yanagisawa et al.

[11] Patent Number: 5,514,881
[45] Date of Patent: May 7, 1996

[54] GAP LIGHT EMITTING DEVICE HAVING A LOW CARBON CONTENT IN THE SUBSTRATE

[75] Inventors: Munehisa Yanagisawa, Takasaki; Susumu Higuchi, Annaka; Yu K. Tamura, Annaka; Akio Nakamura, Annaka; Toshio Otaki, Takasaki, all of Japan

[73] Assignee: Shin-Etsu Handotai Co., Ltd., Tokyo, Japan

[21] Appl. No.: 377,132

[22] Filed: Jan. 23, 1995

Related U.S. Application Data

[63] Continuation-in-part of Ser. No. 38,693, Mar. 29, 1993, abandoned.

Foreign Application Priority Data

Jul. 31, 1992 [JP] Japan .................................. 4-225324

[51] Int. Cl.⁶ .................................................. H01L 33/00
[52] U.S. Cl. .......................... 257/101; 257/102; 257/103
[58] Field of Search ............................... 257/87, 89, 101, 257/102, 103

[56] References Cited

U.S. PATENT DOCUMENTS 4,017,880  4/1977  Kasami et al. ........................ 257/102

Primary Examiner—Rolf Hille
Assistant Examiner—Minhloan Tran
Attorney, Agent, or Firm—Townsend & Banta

[57] ABSTRACT

A semiconductor substrate for GaP type light emitting devices which includes an n-type single crystal substrate, an n-type GaP layer, and a p-type GaP layer formed on the n-type GaP single crystal substrate. The carbon concentration in the n-type GaP single crystal substrate is more than $1.0 \times 10^{16}$ atoms/cc, but less than $1.0 \times 10^{17}$ atoms/cc. The n-type GaP single crystal substrate is obtained from an n-type GaP single crystal grown by the Liquid Encapsulation Czochralski method wherein $B_2O_3$ containing water corresponding to 200 ppm or more is used as an encapsulation liquid.

4 Claims, 4 Drawing Sheets

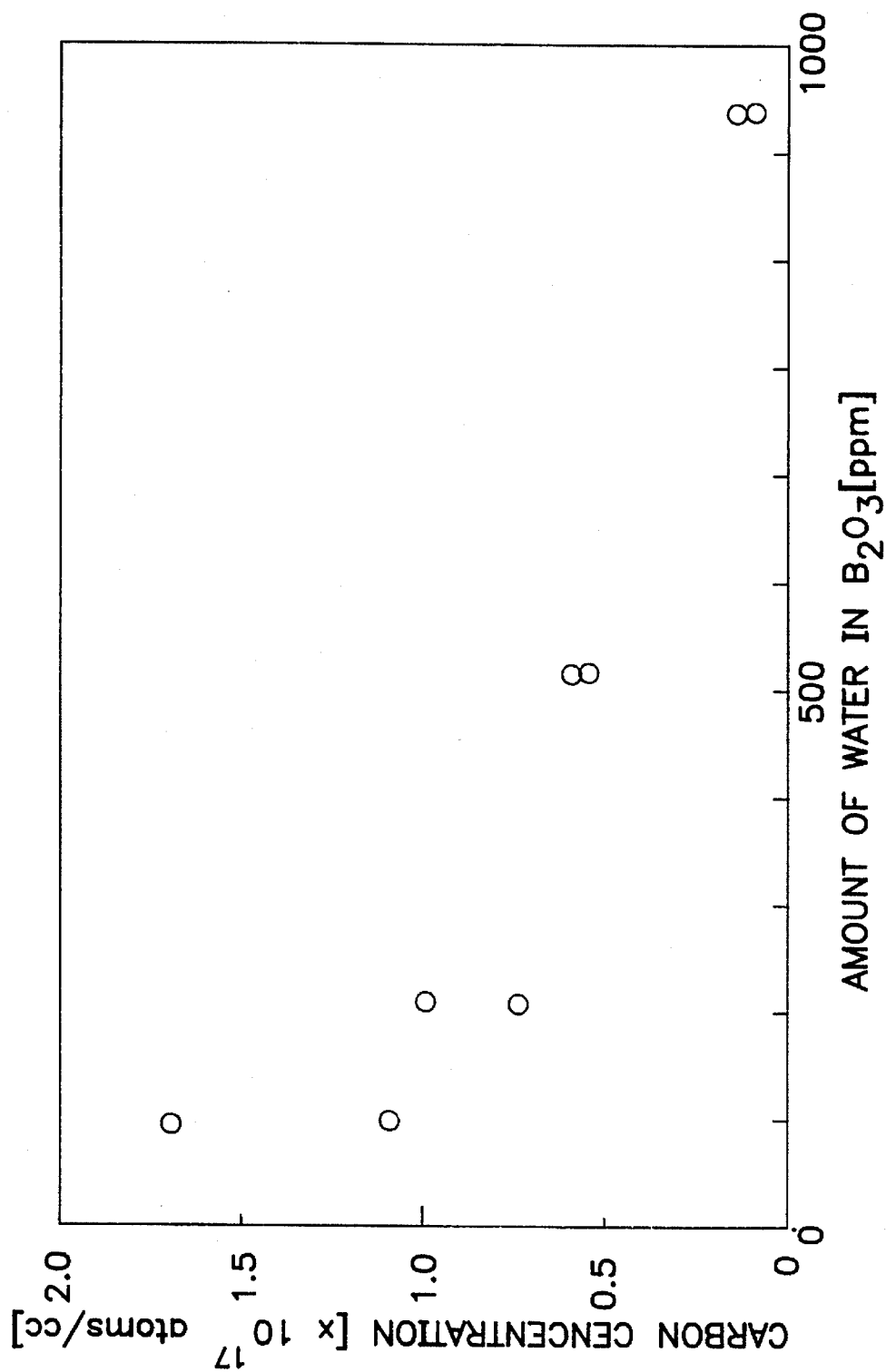

GAP LIGHT EMITTING DEVICE HAVING A LOW CARBON CONTENT IN THE SUBSTRATE

CROSS REFERENCE TO RELATED APPLICATION

This application is a Continuation-In-Part application of U.S. patent application Ser. No. 08/038,693 filed Mar. 29, 1993, now abandoned.

FIELD OF THE INVENTION

This invention relates to a semiconductor substrate for GaP type light emitting devices and a to method for fabricating the same and, in particular, to a semiconductor substrate for GaP type light emitting devices in which a plurality of GaP layers are used in fabricating GaP type light emitting devices which emit red light.

BACKGROUND OF THE INVENTION

Light emitting devices are generally fabricated by the steps of forming a plurality of semiconductor layers on a semiconductor substrate to fabricate a multi-layer semiconductor substram having a pn junction, and fabricating the substrates to devices. Among these light emitting devices, GaP type light emitting diodes, which emit red light, are fabricated from a semiconductor substrate for the light emitting devices consisting of an n-type GaP single crystal substrate on which n-type and p-type GaP layers are formed.

The compound semiconductor GaP does not emit red light by itself even if a pn junction is formed in a substate consisting thereof, so that zinc (Zn) and oxygen (O) are doped into a p-type layer, and pairs of Zn—O, which become light emitting centers, are formed in the p-type layer. GaP type light emitting diodes fabricated from the semiconductor substate for GaP type light emitting devices emit red light having a peak wavelength of about 700 nm.

However, according to the conventional light emitting devices fabricated from the semiconductor substrate for GaP type light emitting devices processed by the above conventional method, there is a disadvantage in that substantially high luminance cannot be obtained.

The semiconductor device disclosed in the U.S. Pat. No. 3,951,699 to Naito et al. employs a single crystal substrate of gallium phosphide doped with Te, a n-type gallium phosphide layer on said gallium phosphide single crystal substrate, and a p-type gallium phosphide layer on the n-type gallium phosphide layer. In this red-emitting device, Naito et al. is concerned with increasing luminescence by varying the cooling rate and heat treatment. However, there is no disclosure in the Naito et al. patent of a semiconductor device having a single crystal substram of gallium phosphide, an n-type gallium phosphide layer thereon and a p-type gallium phosphide layer thereon, wherein the carbon concentration of the n-type gallium phosphide single crystal substram is more than $1 \times 10^{16}$, but less than $\times 10^{17}$ atoms per cc.

Japanese Patent 0016391 to Kawabata et al., discloses growing an n-type GaP epitaxial layer on an n-type GaP substrate using a Te melt donor impurity. The melt is doped with zinc as an acceptor impurity exceeding Te and the melt is slowly cooled to grow p layer. However, the Kawabata et al. patent does not disclose that in a semiconductor device formed from a n-type gallium phosphide single crystal substram with an n-type gallium phosphide layer thereon, and a p-type gallium phosphide layer on the n-type gallium phosphide layer, varying the carbon concentration in the n-type gallium phosphide single crystal substrate would increase or have any effect on the luminescence of the device.

SUMMARY OF THE INVENTION

It is an object of the present invention to provide a semiconductor substrate for GaP type light emitting devices from which light emitting devices having higher luminance than the conventional light emitting devices can be fabricated, and to a method for fabricating the same.

According to the present invention, a semiconductor substrate for GaP type light emitting devices includes an n-type GaP single crystal substrate, an n-type GaP layer, and a p-type GaP layer formed on the n-type GaP single crystal substrate, wherein the concentration of carbon contained in the n-type GaP single crystal substrate is more than $1.0 \times 10^{16}$ atoms/cc, but not more than $1.0 \times 10^{17}$ atoms/cc.

If the n-type GaP single crystal is grown by the Liquid Encapsulation Czochralski (LEC) method, an n-type GaP single crystal containing carbon of the concentration as stated above is obtained by growing the single crystal using boron oxide ($B_2O_3$) as liquid for encapsulation containing at least 200 ppm of water, and then an n-type GaP single crystal substrate containing carbon of the concentration as stated above.

BRIEF DESCRIPTION OF THE DRAWINGS

The present invention is hereinafter explained in more detail in conjunction with the appended drawings.

FIG. 4 is a graph showing the relation between the amount of water in $B_2O_3$ used for growing the n-type GaP single crystal by the LEC method and the carbon concentration in the n-type GaP single crystal substrate obtained from the n-type GaP single crystal.

DESCRIPTION OF THE PREFERRED EMBODIMENT

An embodiment of the present invention will be explained by referring to the attached drawings.

Figure 1:
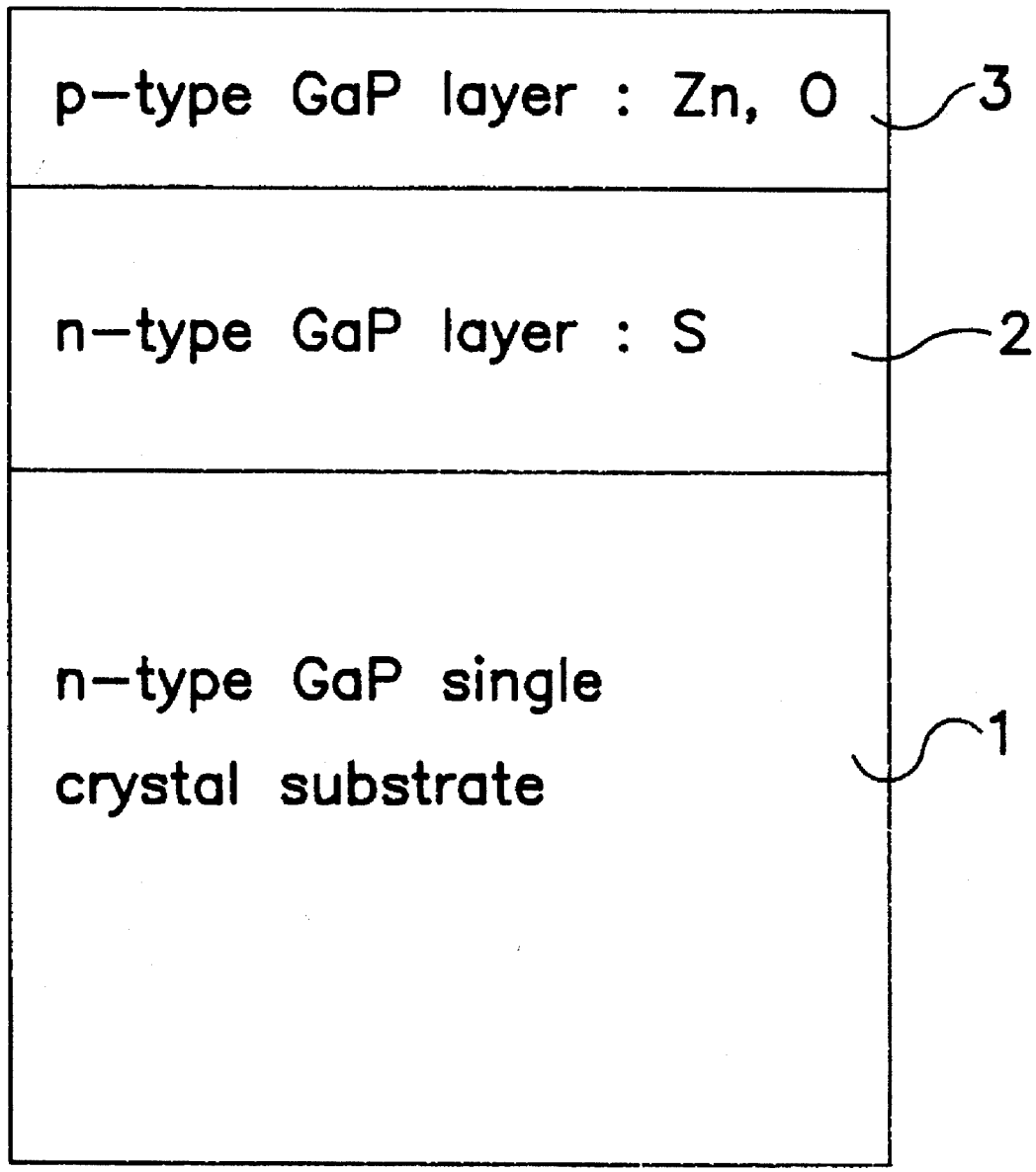
FIG. 1 is a schematic cross-sectional view illustrating the cross-sectional structure of the semicondutor substrate for light emitting devices in an embodiment according to the present invention.

FIG. 1 shows a semiconductor substrate for GaP type light emitting devices in this embodiment. In the semiconductor substrate for GaP type light emitting devices in this embodiment, a n-type GaP layer 2 and a p-type GaP layer 3 are successively formed on an n-type GaP single crystal substrate 1. For example, sulfur (S) and zinc (Zn) are used as dopants as n-type and p-type sources. The p-type GaP layer 3 is doped with oxygen (O), as well as zinc (Zn).

Figure 2:
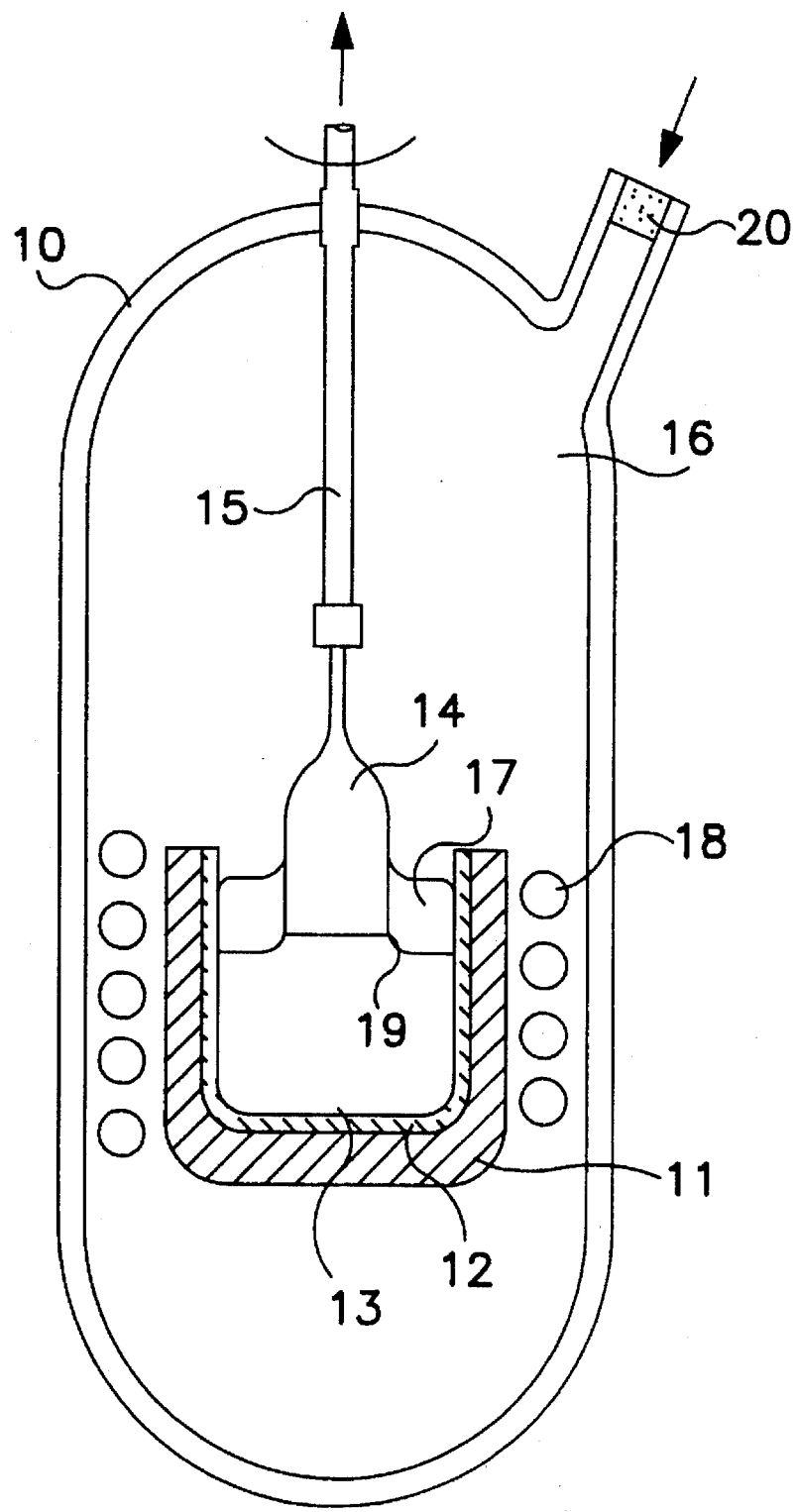
FIG. 2 is a structural view of an apparatus used for growing an n-type GaP single crystal in the embodiment according to the present invention.

An example of a method for fabricating the semiconductor substrate for GaP type light emitting devices mentioned above is hereinafter described. First, the n-type GaP single crystal substrate 1 is fabricated from the n-type GaP single crystal grown by the LEC method. More particularly, the growth step of the GaP single crystal by the LEC method is carried out using an apparatus as shown in FIG. 2. In FIG. 2, a crucible 12 supported by a susceptor 11 is provided in a pressure vessel 10, and a GaP melt 13 is included in the crucible 12.

The GaP melt 13 is covered on the top surface with $B_2O_3$ 17 which is lighter than the GaP melt 13 and is transparent. In order to avoid dissociation of GaP, the inside of the pressure vessel 10 is pressurized with an inert gas, such as nitrogen 16. A GaP single crystal 14 is grown by being pulled out of the GaP melt 13 by a rotating rod 15. Further, the GaP melt 13 is heated by a heater 18 so that an interface 19 between the fused GaP 13 and the GaP single crystal 14 is kept at 1470° C., which corresponds to the melting point of the GaP. For example, the inside of the pressure vessel 10 is monitored through a window 20 by a television monitor.

The GaP single crystal 14 grown by the process explained above is sliced to obtain GaP single crystal substrates 1, and the epitaxial layers are formed on the substrate 1 by the liquid phase epitaxy (LPE). More particularly, a solution which is prepared by dissolving polycrystal GaP into a Ga melt is positioned on the substate at 1000° C. Next, the solution is cooled to make GaP in the solution precipitate and grow a GaP layer on the substrate. In the process, n-type dopants, such as sulfur, are added to the solution for growing the n-type GaP layer 2, and p-type dopants, such as zinc or oxide, are added thereto for growing the p-type GaP layer 3.

Thus, a semiconductor substate for light emitting devices, which is a multi-layer GaP substrate, is obtained in which the n-type GaP layer and the p-type GaP layer are successively formed on the n-type GaP single crystal substrate. Then, n-electrodes are formed on the GaP single crystal substrate side of the semiconductor substrate for light emitting devices, and p-electrodes are formed on the p-type GaP layer side thereof, respectively. Then, after being cut to form chips, each chip is mounted on a frame and wire-bonded, and encapsulated in epoxy resin. Thus, light emitting diodes which emit red light are obtained.

Figure 3:
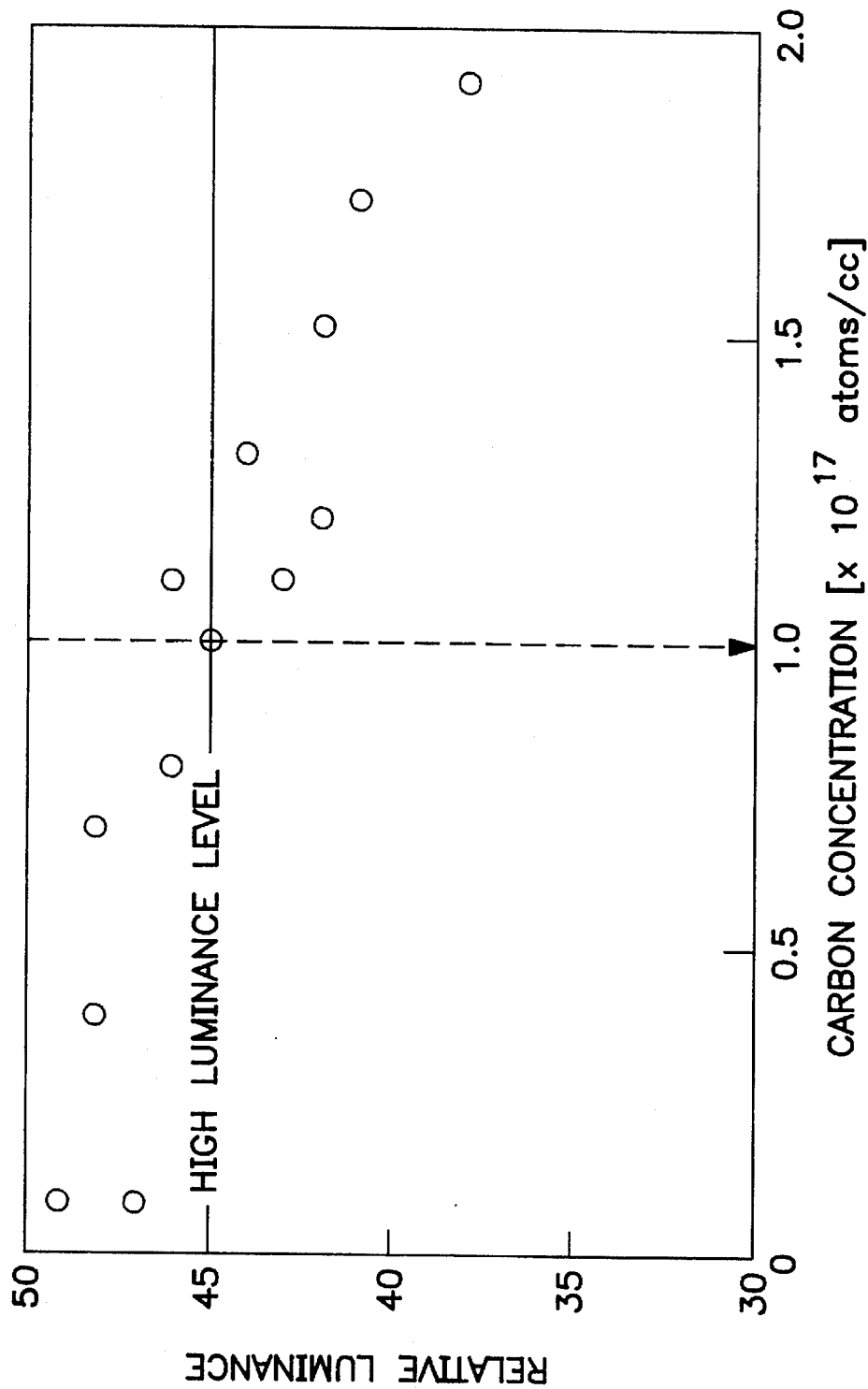
FIG. 3 is a graph showing the relation between the carbon concentration in the n-type GaP single crystal substrate and the luminance of the light emitting device fabricated therefrom.

FIG. 3 shows the relation between the carbon concentration in the n-type GaP single crystal substrate and relative luminance of the light emitting devices which emit red light fabricated from the semiconductor substrate for light emitting devices. As understood by FIG. 3, the luminance becomes higher as the carbon concentration decreases, and the carbon concentration in the n-type GaP single crystal substrate is preferably more than $1.0 \times 10^{16}$ atom/cc, but less than $1.0 \times 10^{17}$ atoms/cc to obtain light emitting devices having relative luminance higher than 45.

In order to obtain the n-type GaP single crystal substrate with a carbon concentration more than $1.0 \times 10^{16}$ atoms/cc, but less than $1.0 \times 10^{17}$ atoms/cc, the n-type GaP single crystal is grown from GaP polycrystal with the original low carbon concentration preferably being used as a starting material. In this method, it is confirmed that the carbon concentration in the GaP single crystal substrate is more than $1.0 \times 10^{16}$ but less than $1.0 \times 10^{17}$ atoms/cc when the GaP polycrystal with the carbon concentration lower than $1.0 \times 10^{18}$ atoms/cc is used as the starting material.

On the other hand, when the n-type GaP single crystal is grown by the LEC method, it is possible to control the carbon concentration by controlling the amount of water contained in $B_2O_3$ used in the growth process as the encapsulation liquid.

FIG. 4 shows the relation between the amount of water contained in $B_2O_3$ used in the growth process and the carbon concentration in the GaP single crystal. As understood by FIG. 4, the carbon concentration in the n-type GaP single crystal becomes low as the amount of water in $B_2O_3$ increases. In particular, the carbon concentration decreases drastically and becomes equal to or lower than $1.0 \times 10^{17}$ atoms/cc when the amount of water in $B_2O_3$ becomes more than 200 ppm. Therefore, the carbon concentration is the n-type GaP single crystal can be kept low by controlling the amount of water in $B_2O_3$ which contributes improvement of luminance of the light emitting devices. Although the amount of water in $B_2O_3$ is not limited inasmuch as the amount of water is not less than 200 ppm, there may be disadvantages in the scope of growing GaP single crystals if the amount of water in $B_2O_3$ is more than 1000 ppm. For example, chemical reactions may occur and the $B_2O_3$ layer may become opaque or crystal growth may be adversely affected.

As described above, according to the present invention, a GaP single crystal substrate in which the carbon concentration is more than $1.0 \times 10^{16}$ atoms/cc, but less than $1.0 \times 10^{17}$ atoms/cc can be obtained, and it is possible to fabricate light emitting devices of high luminance by a semiconductor substrate for light emitting devices including the GaP single crystal substrate.

Although the present invention has been described with respect to specific embodiments for complete and clear disclosure, the appended claims are not to be limited, but are to be construed as embodying all modifications and alternative constructions that may occur to one skilled in the art which fairly fall within the basic teachings herein set forth.

What is claimed:

1. A semiconductor substrate for GaP type light emitting devices comprising:

an n-type GaP single crystal substrate;

an n-type GaP layer formed on said n-type GaP single crystal substrate; and a p-type GaP layer formed on said n-type GaP layer, wherein carbon concentration in said n-type GaP single crystal substrate is more than $1.0 \times 10^{16}$ atoms/cc but less than $1.0 \times 10^{17}$ atoms/cc.

2. A semiconductor for GaP type light emitting devices according to claim 1, wherein said n-type GaP layer is doped with sulfur.

3. A semiconductor for GaP type light emitting devices according to claim 1, wherein said p-type GaP layer is doped with zinc.

4. A semiconductor for GaP type light emitting devices according to claim 1, wherein said p-type GaP layer is doped with oxygen as well as zinc.

* * * * *